US012074233B2

(12) United States Patent
Sewell et al.

(10) Patent No.: US 12,074,233 B2
(45) Date of Patent: Aug. 27, 2024

(54) METALLIZATION OF SOLAR CELLS

(71) Applicant: Maxeon Solar Pte. Ltd., Singapore (SG)

(72) Inventors: Richard Hamilton Sewell, Los Altos, CA (US); David Aaron Randolph Barkhouse, Oakland, CA (US); Junbo Wu, San Jose, CA (US); Michael Cudzinovic, Sunnyvale, CA (US); Paul Loscutoff, Castro Valley, CA (US); Joseph Behnke, San Jose, CA (US); Michel Arsène Olivier Ngamo Toko, Brussels (BE)

(73) Assignee: Maxeon Solar Pte. Ltd., Singapore (SG)

( * ) Notice: Subject to any disclaimer, the term of this patent is extended or adjusted under 35 U.S.C. 154(b) by 328 days.

(21) Appl. No.: 17/404,863

(22) Filed: Aug. 17, 2021

(65) Prior Publication Data

US 2021/0384366 A1    Dec. 9, 2021

Related U.S. Application Data

(60) Continuation of application No. 15/170,786, filed on Jun. 1, 2016, now Pat. No. 11,127,866, which is a
(Continued)

(51) Int. Cl.
*H01L 31/0224* (2006.01)
*H01L 31/02* (2006.01)
(Continued)

(52) U.S. Cl.
CPC ........... *H01L 31/022441* (2013.01); *H01L 31/02008* (2013.01); *H01L 31/0682* (2013.01);
(Continued)

(58) Field of Classification Search
None
See application file for complete search history.

(56) References Cited

U.S. PATENT DOCUMENTS 9,362,427 B2    6/2016  Sewell et al.
2007/0256728 A1  11/2007  Cousins
(Continued)

FOREIGN PATENT DOCUMENTS

CN    101820009    9/2010
CN    102290473    12/2011
(Continued)

OTHER PUBLICATIONS

International Search Report and Written Opinion for PCT Patent Application No. PCT/US2014/071318 mailed Mar. 27, 2015, 11 pgs.
(Continued)

*Primary Examiner* — Robert K Carpenter
(74) *Attorney, Agent, or Firm* — Schwabe, Williamson & Wyatt, P.C.

(57) ABSTRACT

Approaches for the metallization of solar cells and the resulting solar cells are described. In an example, a method of fabricating a solar cell involves forming a barrier layer on a semiconductor region disposed in or above a substrate. The semiconductor region includes monocrystalline or polycrystalline silicon. The method also involves forming a conductive paste layer on the barrier layer. The method also involves forming a conductive layer from the conductive paste layer. The method also involves forming a contact structure for the semiconductor region of the solar cell, the contact structure including at least the conductive layer.

13 Claims, 10 Drawing Sheets

Related U.S. Application Data division of application No. 14/137,782, filed on Dec. 20, 2013, now Pat. No. 9,362,427.

(51) Int. Cl.
  *H01L 31/068* (2012.01)
  *H01L 31/0745* (2012.01)

(52) U.S. Cl.
  CPC ........ *H01L 31/0745* (2013.01); *Y02E 10/547* (2013.01); *Y02P 70/50* (2015.11)

(56) References Cited

U.S. PATENT DOCUMENTS

| | | |
|---|---|---|
| 2009/0325327 A1 | 12/2009 | Rohatgi et al. |
| 2010/0037941 A1 | 2/2010 | Borland et al. |
| 2011/0041911 A1 | 2/2011 | Lee et al. |
| 2011/0162706 A1* | 7/2011 | Borden ............ H01L 31/03682 257/E31.119 |
| 2011/0315217 A1 | 12/2011 | Gee |
| 2012/0031484 A1 | 2/2012 | Matsuno et al. |
| 2012/0111399 A1 | 5/2012 | Kondo |
| 2012/0222735 A1 | 9/2012 | Xu |
| 2012/0273043 A1 | 11/2012 | Lochtefeld et al. |
| 2013/0065351 A1 | 3/2013 | Baker-O'Neal et al. |
| 2013/0104973 A1 | 5/2013 | Jee et al. |
| 2013/0147003 A1 | 6/2013 | Kim et al. |
| 2014/0287583 A1 | 9/2014 | Liu et al. |
| 2014/0299187 A1* | 10/2014 | Chang ............... H01L 31/02168 136/258 |
| 2014/0335646 A1 | 11/2014 | Tous et al. |
| 2015/0303323 A1 | 10/2015 | Li et al. |

FOREIGN PATENT DOCUMENTS

| | | |
|---|---|---|
| CN | 102667961 | 9/2012 |
| CN | 102782810 | 11/2012 |
| TW | 2012/19536 | 5/2012 |
| WO | WO 2013/000026 | 1/2013 |

OTHER PUBLICATIONS

FAI Pre-Interview Communication from U.S. Appl. No. 14/137,782 mailed Apr. 2, 2015, 4 pgs.
FAI Office Action Summary from U.S. Appl. No. 14/137,782 mailed Aug. 28, 2015, 8 pgs.
International Preliminary Report on Patentability for Patent Application No. PCT/US2014/071318 mailed Jun. 30, 2016, 9 pgs.
First Office Action from Chinese Patent Application No. 2014800687568 mailed Apr. 24, 2017, 10 pgs.
FAI Pre-Interview Communication from U.S. Appl. No. 15/170,786 dated Apr. 9, 2018, 7 pgs.
FAI Office Action from U.S. Appl. No. 15/170,786 dated Sep. 11, 2018, 7 pgs.
Office Action for Taiwan Patent Application No. 103144668 issued Sep. 12, 2018; 9 pgs.
Final Office Action from U.S. Appl. No. 15/170,786 dated Mar. 8, 2019, 10 pgs.
Non-Final Office Action from U.S. Appl. No. 15/170,786 dated Jun. 25, 2019, 10 pgs.
Non-Final Office Action from U.S. Appl. No. 15/170,786 dated Apr. 6, 2020, 44 pgs.
Final Office Action from U.S. Appl. No. 15/170,786 dated Jan. 25, 2021, 25 pgs.

* cited by examiner

METALLIZATION OF SOLAR CELLS

CROSS-REFERENCE TO RELATED APPLICATIONS

This application is a continuation of U.S. patent application Ser. No. 15/170,786, filed on Jun. 1, 2016, which is a divisional of U.S. patent application Ser. No. 14/137,782, filed on Dec. 20, 2013, now U.S. Pat. No. 9,362,427, issued Jun. 7, 2016, the entire contents of which are hereby incorporated by reference herein.

TECHNICAL FIELD

Embodiments of the present disclosure are in the field of renewable energy and, in particular, include approaches for the metallization of solar cells and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Approaches for the metallization of solar cells and the resulting solar cells are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are methods of fabricating solar cells. In an embodiment, a method of fabricating a solar cell involves forming a barrier layer on a semiconductor region disposed in or above a substrate. The semiconductor region includes monocrystalline or polycrystalline silicon. The method also involves forming a conductive paste layer on the barrier layer. The method also involves forming a conductive layer from the conductive paste layer. The method also involves forming a contact structure for the semiconductor region of the solar cell, the contact structure including at least the conductive layer.

Also disclosed herein are solar cells. In an embodiment, a solar cell includes a substrate. A polycrystalline silicon layer of an emitter region is disposed above the substrate. A contact structure is disposed on the polycrystalline silicon layer of the emitter region and includes a conductive layer in contact with a barrier layer disposed on the polycrystalline silicon layer of the emitter region. The conductive layer includes a matrix binder having aluminum-containing particles dispersed therein.

In another embodiment, a solar cell includes a monocrystalline silicon substrate. A diffusion region is disposed in the monocrystalline silicon substrate. A contact structure is disposed on the diffusion region and includes a conductive layer in contact with a barrier layer disposed on the diffusion region. The conductive layer includes a matrix binder having aluminum-containing particles dispersed therein.

In a first exemplary cell, a barrier layer is used during the fabrication of contacts, such as back-side contacts, for a solar cell having emitter regions formed above a substrate of the solar cell. For example, FIG. 1A illustrates a cross-sectional view of a portion of a solar cell having contact structures formed on emitter regions formed above a substrate, in accordance with an embodiment of the present disclosure.

Figure 1A:
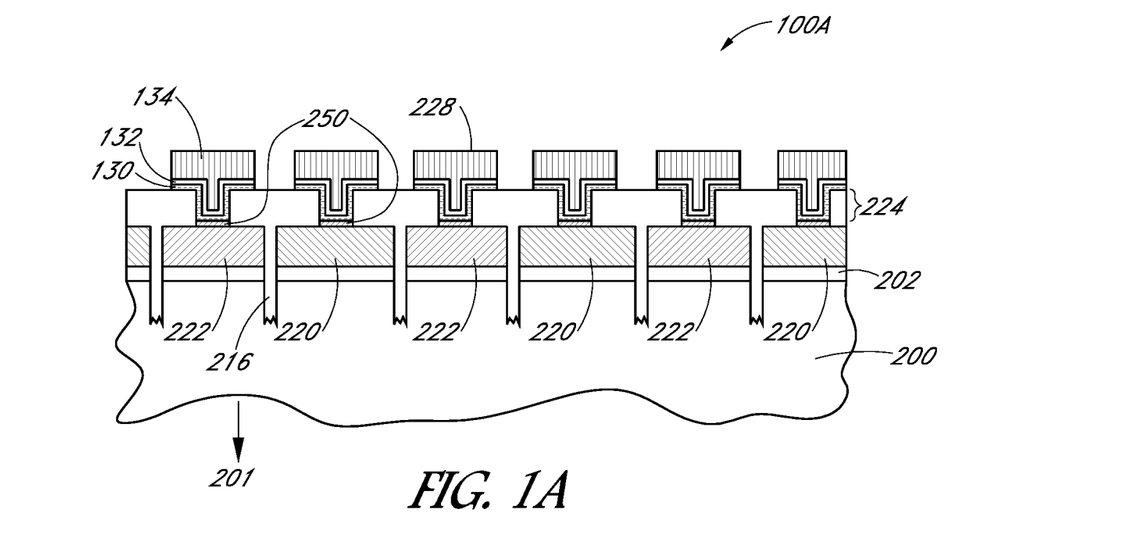
FIG. 1A illustrates a cross-sectional view of a portion of a solar cell having contact structures formed on emitter regions formed above a substrate, in accordance with an embodiment of the present disclosure.

Referring to FIG. 1A, a portion of a solar cell 100A includes a patterned dielectric layer 224 disposed above a plurality of n-type doped polysilicon regions 220, a plurality of p-type doped polysilicon regions 222, and on portions of a substrate 200 exposed by trenches 216. Contact structures 228 are disposed in a plurality of contact openings disposed in the dielectric layer 224 and are coupled to the plurality of n-type doped polysilicon regions 220 and to the plurality of p-type doped polysilicon regions 222. The materials of, and methods of fabricating, the patterned dielectric layer, the plurality of n-type doped polysilicon regions 220, the plurality of p-type doped polysilicon regions 222, the substrate 200, and the trenches 216 may be as described below in association with FIGS. 2A-2C. Furthermore, the plurality of n-type doped polysilicon regions 220 and the plurality of p-type doped polysilicon regions 222 can, in one embodiment, provide emitter regions for the solar cell 100A. Thus, in an embodiment, the contact structures 228 are disposed on the emitter regions. In an embodiment, the contact structures 228 are back contacts for a back-contact solar cell and are situated on a surface of the solar cell opposing a light receiving surface (direction provided as 201 in FIG. 1A) of the solar cell 100A. Furthermore, in one embodiment, the emitter regions are formed on a thin or tunnel dielectric layer 202, described in greater detail in association with FIG. 2A.

Referring again to FIG. 1A, each of the contact structures 228 includes a conductive layer 130 (also referred to herein as a seed layer) in contact with a barrier layer 250 disposed on the emitter regions of the solar cell 100A. In an embodiment, the conductive layer 130 includes a matrix binder having aluminum-containing particles dispersed therein.

In accordance with a first aspect of the disclosure, and as described in greater detail below in association with FIGS. 4A-4D and 5A-5E, in an embodiment, the barrier layer 250 is a metal-containing layer. In one such embodiment, the metal-containing layer includes a metal such as, but not limited to, nickel (Ni), titanium (Ti) or tungsten (W).

In accordance with a second aspect of the disclosure, and as described in greater detail below in association with FIGS. 6A and 6B, in an embodiment, the barrier layer 250 is a tunneling dielectric layer. In one such embodiment, the tunneling dielectric layer is a thin silicon oxide layer.

In accordance with a second aspect of the disclosure, and as described in greater detail below in association with FIGS. 7A-7D, in an embodiment, the barrier layer 250 is a metal silicide layer. In one such embodiment, the metal silicide layer is a nickel (Ni) silicide layer.

With reference to all three of the above described aspects, in an embodiment, the aluminum-containing particles are aluminum/silicon (Al/Si) particles. In another embodiment, however, the aluminum-containing particles are aluminum-only particles. In an embodiment, the contact structure 228 further includes a nickel (Ni) or zinc (Zn) layer 132, or both, disposed on the conductive layer 130. A copper (Cu) layer 134 is disposed on the Ni or Zn layer 132. However, in another embodiment, no additional conductive layers are disposed on the conductive layer 130.

In a second exemplary cell, a barrier layer is used during the fabrication of contacts, such as back-side contacts, for a solar cell having emitter regions formed in a substrate of the solar cell. For example, FIG. 1B illustrates a cross-sectional view of a portion of a solar cell having contact structures formed on emitter regions formed in a substrate, in accordance with an embodiment of the present disclosure.

Figure 1B:
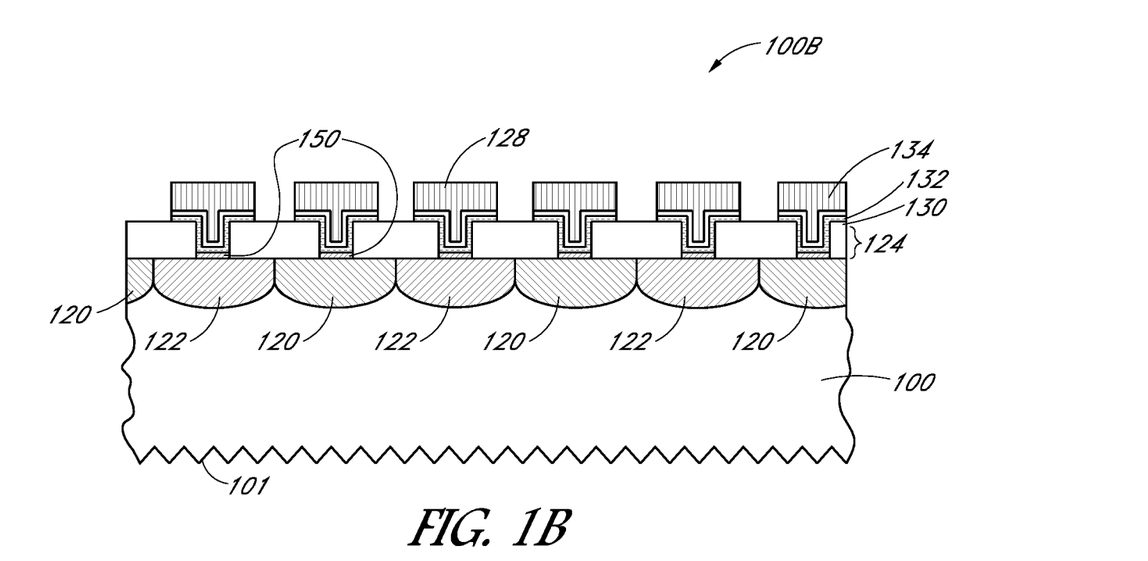
FIG. 1B illustrates a cross-sectional view of a portion of a solar cell having contact structures formed on emitter regions formed in a substrate, in accordance with an embodiment of the present disclosure.

Referring to FIG. 1B, a portion of a solar cell 100B includes a patterned dielectric layer 124 disposed above a plurality of n-type doped diffusion regions 120, a plurality of p-type doped diffusion regions 122, and on portions of a substrate 100, such as a bulk crystalline silicon substrate. Contact structures 128 are disposed in a plurality of contact openings disposed in the dielectric layer 124 and are coupled to the plurality of n-type doped diffusion regions 120 and to the plurality of p-type doped diffusion regions 122. In an embodiment, the diffusion regions 120 and 122 are formed by doping regions of a silicon substrate with n-type dopants and p-type dopants, respectively. Furthermore, the plurality of n-type doped diffusion regions 120 and the plurality of p-type doped diffusion regions 122 can, in one embodiment, provide emitter regions for the solar cell 100B. Thus, in an embodiment, the contact structures 128 are disposed on the emitter regions. In an embodiment, the contact structures 128 are back contacts for a back-contact solar cell and are situated on a surface of the solar cell opposing a light receiving surface, such as opposing a texturized light receiving surface 101, as depicted in FIG. 1B. In an embodiment, referring again to FIG. 1B, each of the contact structures 128 includes a conductive layer 130 in contact with a barrier layer 150 disposed on the emitter regions (i.e., diffusion regions) of the solar cell 100B. In an embodiment, the conductive layer 130 includes a matrix binder having aluminum-containing particles dispersed therein. Furthermore, the contact structures 128, the conductive layer 130 and the barrier layer 150 of FIG. 1B may be similar to or the same as the contact structures 228, the conductive layer 130 and the barrier layer 250 described above in association with FIG. 1A.

Although certain materials are described specifically above with reference to FIGS. 1A and 1B, some materials may be readily substituted with others with other such embodiments remaining within the spirit and scope of embodiments of the present disclosure. For example, in an embodiment, a different material substrate, such as a group III-V material substrate, can be used instead of a silicon substrate. In another embodiment, silver (Ag) particles or the like can be used in a conductive layer in addition to, or instead of Al or Al/Si particles. In another embodiment, plated or like-deposited cobalt (Co) or tungsten (W) can be used instead of or in addition to the Ni layer described above.

Figure 2A:
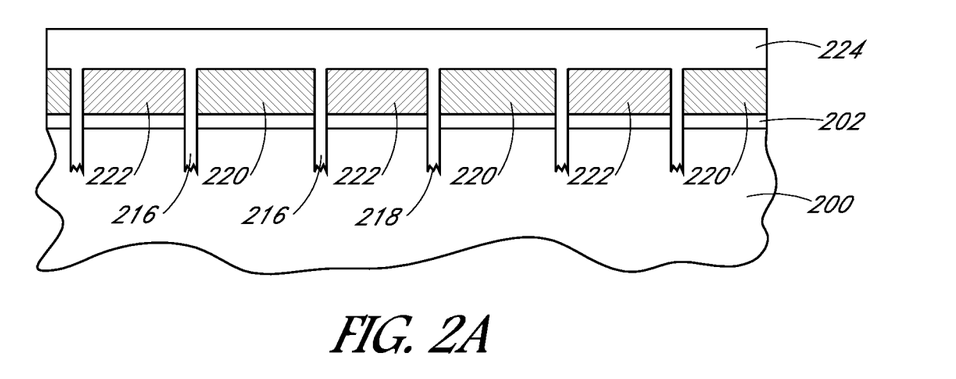
FIGS. 2A-2C illustrate cross-sectional views of various processing operations in a method of fabricating solar cells having contact structures, in accordance with an embodiment of the present disclosure.
Figure 2B:
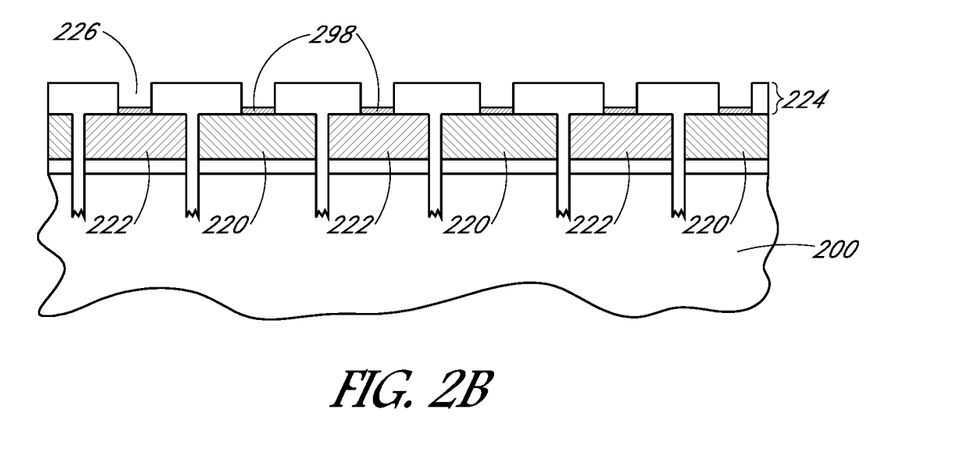
Figure 2C:
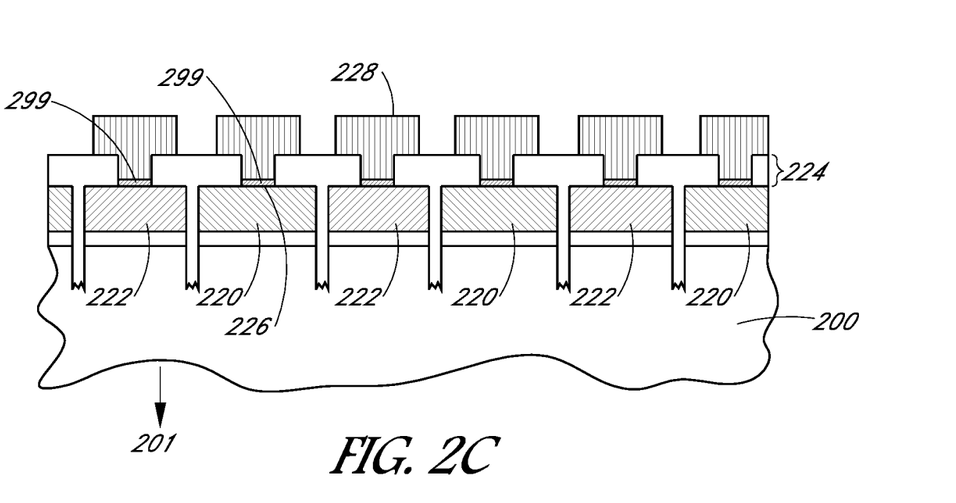
Figure 3:
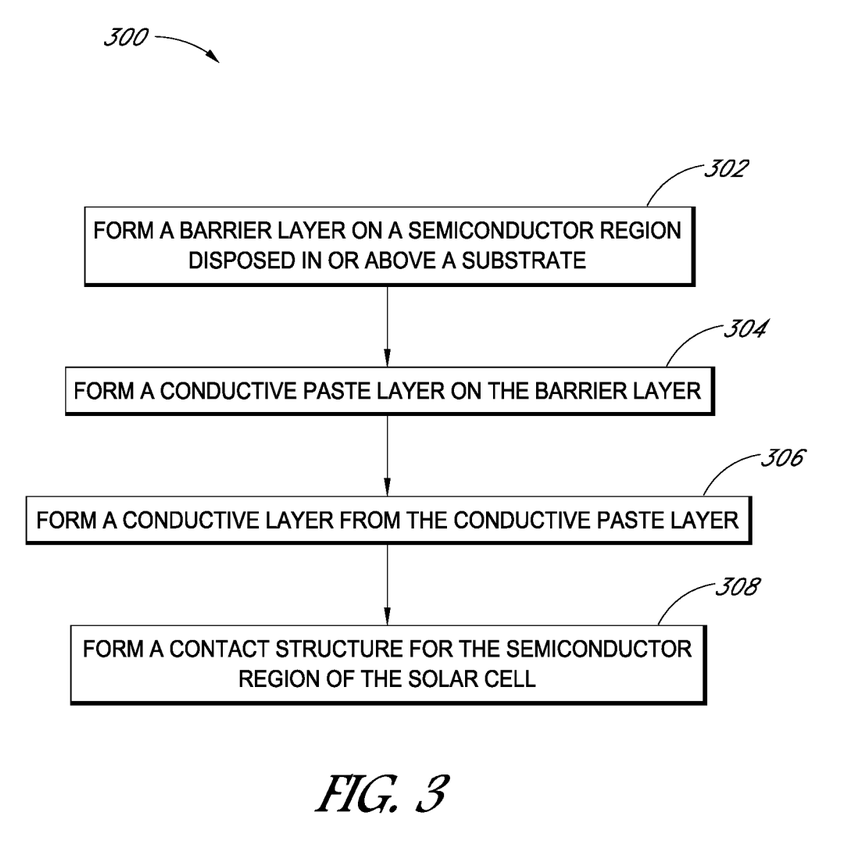
FIG. 3 is a flowchart illustrating operations in a method of fabricating a solar cell, in accordance with an embodiment of the present disclosure.

Furthermore, the formed contacts need not be formed directly on a bulk substrate, as was described in FIG. 1B. For example, in one embodiment, contact structures such as those described above are formed on semiconducting regions formed above (e.g., on a back side of) as bulk substrate, as was described for FIG. 1A. As a fabrication process example, FIGS. 2A-2C illustrate cross-sectional views of various processing operations in a method of fabricating solar cells having contact structures, in accordance with an embodiment of the present disclosure. FIG. 3 is a flowchart 300 illustrating operations in a method of fabricating a solar cell corresponding to the exemplary operations described in association with FIGS. 2B and 2C, in accordance with an embodiment of the present disclosure.

Referring to FIG. 2A, a method of forming contacts for a back-contact solar cell includes forming a thin dielectric layer 202 on a substrate 200.

In an embodiment, the thin dielectric layer 202 is composed of silicon dioxide and has a thickness approximately in the range of 5-50 Angstroms. In one embodiment, the thin dielectric layer 202 performs as a tunneling oxide layer. In an embodiment, substrate 200 is a bulk monocrystalline silicon substrate, such as an n-type doped monocrystalline silicon substrate. However, in an alternative embodiment, substrate 200 includes a polycrystalline silicon layer disposed on a global solar cell substrate.

Referring again to FIG. 2A, trenches 216 are formed between n-type doped polysilicon regions 220 and p-type doped polysilicon regions 222. Portions of the trenches 216 can be texturized to have textured features 218, as is also depicted in FIG. 2A. A dielectric layer 224 is formed above the plurality of n-type doped polysilicon regions 220, the plurality of p-type doped polysilicon regions 222, and the portions of substrate 200 exposed by trenches 216. In one embodiment, a lower surface of the dielectric layer 224 is formed conformal with the plurality of n-type doped polysilicon regions 220, the plurality of p-type doped polysilicon regions 222, and the exposed portions of substrate 200, while an upper surface of dielectric layer 224 is substantially flat, as depicted in FIG. 2A. In a specific embodiment, the dielectric layer 224 is an anti-reflective coating (ARC) layer.

Referring to FIG. 2B, a plurality of contact openings 226 is formed in the dielectric layer 224. The plurality of contact openings 226 provides exposure to the plurality of n-type doped polysilicon regions 220 and to the plurality of p-type doped polysilicon regions 222. In one embodiment, the plurality of contact openings 226 is formed by laser ablation. In one embodiment, the contact openings 226 to the n-type doped polysilicon regions 220 have substantially the same height as the contact openings to the p-type doped polysilicon regions 222, as depicted in FIG. 2B.

Referring again to FIG. 2B, and to corresponding operation 302 of flowchart 300, a barrier layer 298 is formed on the exposed portions of each of the plurality of n-type doped polysilicon regions 220 and to the plurality of p-type doped polysilicon regions 222.

In accordance with the first aspect of the disclosure, and as described in greater detail below in association with FIGS. 4A-4D and 5A-5E, in an embodiment, the barrier layer 298 is a metal-containing layer. In one such embodiment, the metal-containing layer includes a metal such as, but not limited to, nickel (Ni), titanium (Ti) or tungsten (W). In another embodiment, the barrier layer 298 is an insulating layer. In one such embodiment, the insulating layer includes a silicon oxide layer. In a particular such embodiment, the insulating layer further includes a partially recessed silicon nitride layer on the silicon oxide layer.

In accordance with the second aspect of the disclosure, and as described in greater detail below in association with FIGS. 6A and 6B, in an embodiment, the barrier layer 298 is a tunneling dielectric layer. In one such embodiment, the term "tunneling dielectric layer" refers to a very thin (e.g., less than approximately 10 nm) dielectric layer, through which electrical conduction can be achieved. The conduction may be due to quantum tunneling and/or the presence of small regions of direct physical connection through thin spots in the dielectric layer. In one embodiment, the tunneling dielectric layer is or includes a thin silicon oxide layer. In an embodiment, a silicon layer is further formed on the tunneling dielectric layer.

In accordance with the third aspect of the disclosure, and as described in greater detail below in association with FIGS. 7A-7D, in an embodiment, the barrier layer 298 includes a metal silicide layer. In one such embodiment, the metal silicide layer is formed by consuming a portion of the silicon from the plurality of n-type doped polysilicon regions 220 and to the plurality of p-type doped polysilicon regions 222. In one embodiment, the metal silicide layer is formed by first forming a nickel silicide layer by plating a nickel (Ni) layer, activating the Ni layer, and annealing the Ni layer to react with the plurality of n-type doped polysilicon regions 220 and to the plurality of p-type doped polysilicon regions 222. In a particular such embodiment, subsequent to annealing the Ni layer, any unreacted Ni is removed.

Referring to FIG. 2C, the method of forming contacts for the back-contact solar cell further includes forming contact structures 228 in the plurality of contact openings 226 and coupled to the plurality of n-type doped polysilicon regions 220 and to the plurality of p-type doped polysilicon regions 222. Thus, in an embodiment, contact structures 228 are formed on or above a surface of a bulk N-type silicon substrate 200 opposing a light receiving surface 201 of the bulk N-type silicon substrate 200. In a specific embodiment, the contact structures are formed on regions (222/220) above the surface of the substrate 200, as depicted in FIG. 2C.

More particularly, referring to operation 304 of flowchart 300, a conductive paste layer (not shown) is formed on the barrier layer 298 of FIG. 2B. In an embodiment, the conductive paste layer is formed from a mixture including aluminum (Al) and/or aluminum/silicon (Al/Si) particles, a liquid binder, and a frit material. In an embodiment, the conductive paste layer is formed by screen printing. Referring again to FIG. 2C and now to corresponding operation 306 of flowchart 300, a conductive layer 299 is formed from the conductive paste layer, e.g., by laser or thermal anneal. Referring again to FIG. 2C and now to corresponding operation 308 of flowchart 300, a contact structure 228 is formed to include at least the conductive layer 299. Additionally, in an embodiment, the barrier layer 298 described in association with FIG. 2B is retained and ultimately disposed between the contact structures 228 and the plurality of n-type doped polysilicon regions 220 and the plurality of p-type doped polysilicon regions 222 (not shown). However, in other embodiments, the barrier layer 298 is removed prior to or during the fabrication of contact structures 228, as is depicted in FIG. 2C. Exemplary embodiments of the above operations are provided below.

In accordance with the first aspect of the disclosure, and as described in greater detail below in association with FIGS. 4A-4D and 5A-5E, in an embodiment, the barrier layer 298 of FIG. 2B is a metal-containing layer, and the conductive layer 299 is formed in contact with the metal-containing layer. In another embodiment, the barrier layer 298 of FIG. 2B is an insulating layer, and the conductive layer 299 is formed through the insulating layer and in contact with the semiconductor region (e.g., region 220 or 222) of the solar cell.

In accordance with the second aspect of the disclosure, and as described in greater detail below in association with FIGS. 6A and 6B, in an embodiment, the barrier layer 298 of FIG. 2B is a tunneling dielectric layer having a silicon layer formed thereon, and the conductive layer 299 is formed by consuming at least a portion of the silicon layer with the conductive paste layer. In an embodiment, conductive layer 299 is formed in contact with the tunneling dielectric layer.

In accordance with the third aspect of the disclosure, and as described in greater detail below in association with FIGS. 7A-7D, in an embodiment, the barrier layer 298 of FIG. 2B is a metal silicide layer, and the conductive layer 299 is formed in contact with the metal silicide layer. In one such embodiment, the conductive paste layer is an aluminum (Al) paste layer used to form the conductive layer 299 is formed on a nickel silicide layer.

With reference to all three of the above described aspects, in an embodiment, forming the conductive layer 299 from the conductive paste layer involves firing the conductive paste layer at a temperature above approximately 500 degrees Celsius for a duration of at least approximately 10 minutes. Furthermore, it is to be appreciated that the conductive layer 299 may be used on its own to form contact structures); in such cases, the conductive layer 299 may still be referred to herein as a seed layer. Alternatively, completion of the contact structures 228 further involves plating a nickel (Ni) layer on the conductive layer 299, and electroplating a copper (Cu) layer on the Ni layer, e.g., to form structures such as those described in association with FIGS. 1A and 1B. In yet another alternative embodiment, forming the contact structures 228 further involves electroplating a copper (Cu) layer directly on the conductive layer 299. Generally, as used in embodiments throughout, a formed paste layer (e.g., a deposited paste formed by printing) can further include a solvent for ease of delivery.

As described briefly above, and in greater detail below in association with FIGS. 4A-4D and 5A-5E, in a first aspect of the present disclosure, barrier layers are used to enable high temperature firing of printed metal for solar cell contact formation. One or more embodiments addresses both adhesion and contact resistance issues for printed metals by placing a continuous barrier layer between a paste layer and a monocrystalline or polysilicon region to prevent or retard diffusion of the polysilicon into the paste (e.g., to prevent silicon consumption). Furthermore, in some cases, a continuous metal semiconductor or silicide-semiconductor interface is provided to improve contact resistance.

To provide further context, printed seed processing typically involves use of an aluminum-silicon paste which is fired below approximately 560 degrees Celsius in order to prevent diffusion of polysilicon (e.g., from an emitter region) into the paste. Firing time may be limited to approximately 30 minutes in order to prevent degradation of lifetime. Such an upper limit on the firing temperature and time can limit the degree of particle sintering which is possible, which in turn limits the degree of adhesion. Paste to silicon contact resistance may also limited by relatively small area of point contacts that can be made between mostly spherical particles in the paste and the planar exposed polysilicon in the contact openings.

In a first example, FIGS. 4A-4D illustrate cross-sectional views of various processing operations in another method of fabricating solar cells having contact structures, in accordance with an embodiment of the present disclosure.

Figure 4A:
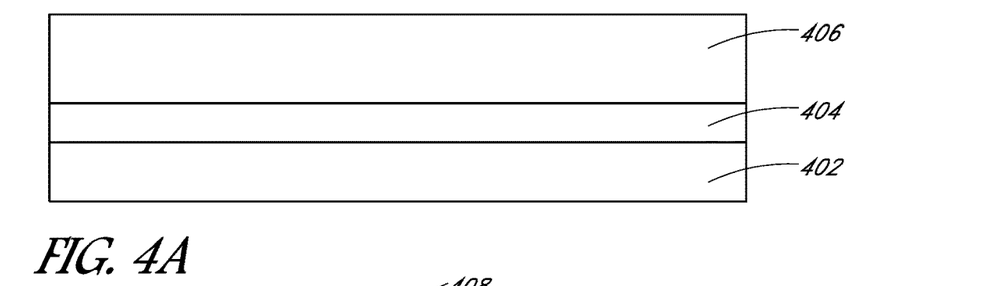
FIGS. 4A-4D illustrate cross-sectional views of various processing operations in another method of fabricating solar cells having contact structures, in accordance with an embodiment of the present disclosure.

Referring to FIG. 4A, a silicon substrate or region 402 has an insulating layer 404 formed thereon. In an embodiment, the insulating layer is a silicon oxide layer having a thickness of approximately 100 Angstroms. In one such embodiment, an additional insulating layer 406 is disposed thereon, such as a silicon nitride layer.

Figure 4B:
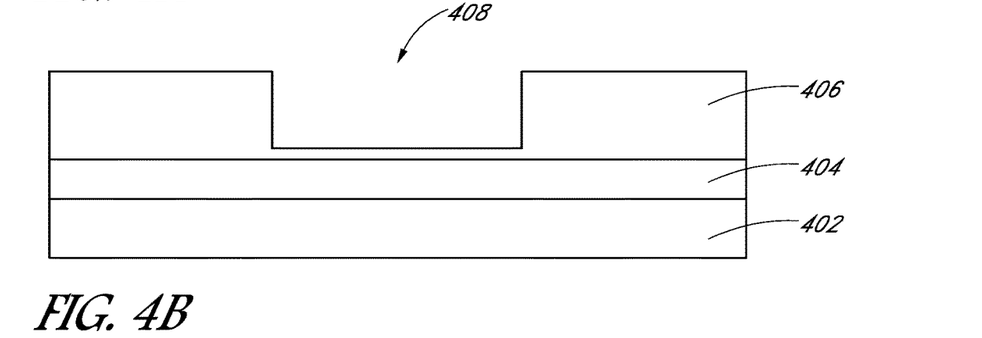

Referring to FIG. 4B, the additional insulating layer 406 is recessed to form a trench 408 above the silicon substrate or region 402. In one such embodiment, the additional insulating layer 406 is only partially recessed, as shown. However, in another embodiment, the trench 408 is formed to expose the insulating layer 404.

Figure 4C:
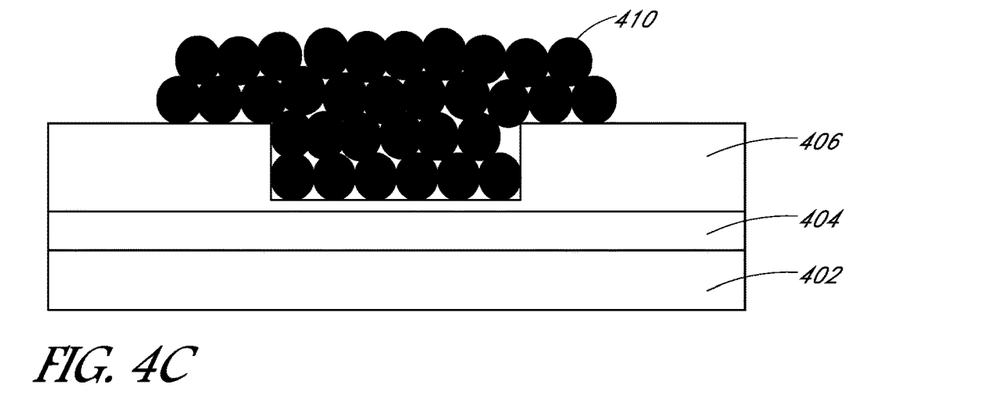

Referring to FIG. 4C, a metal paste 410 is formed in the trench 408 and is separated from the silicon substrate or region 402 by at least the insulating layer 404. In an embodiment, the metal paste 410 is printed and includes Al or Al/Si particles, as described above.

Figure 4D:
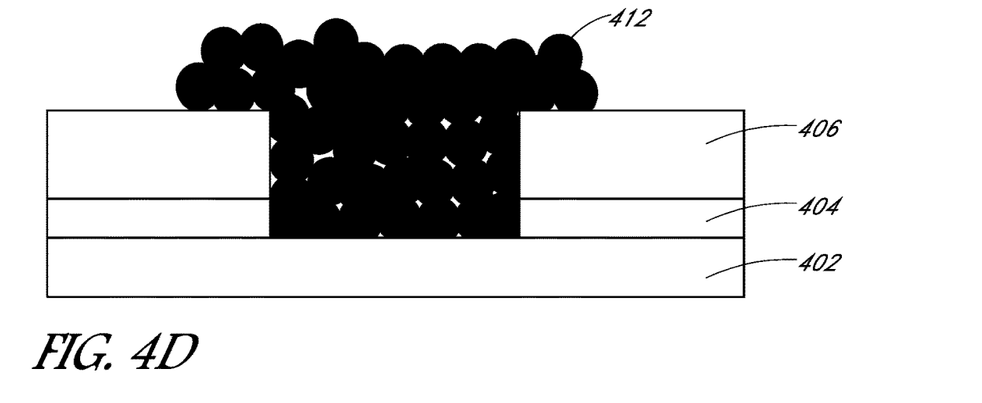

Referring to FIG. 4D, the metal paste 410 is fired (e.g., thermally annealed or laser annealed) to form a conductive layer 412. The conductive layer 412 breaks through the insulating layer 404 to directly contact the silicon substrate or region 402. In accordance with an embodiment of the present disclosure, the conductive layer 412 is used to fabricate a conductive contact structure for a solar cell.

In a second example, FIGS. 5A-5E illustrate cross-sectional views of various processing operations in another method of fabricating solar cells having contact structures, in accordance with an embodiment of the present disclosure.

Figure 5A:
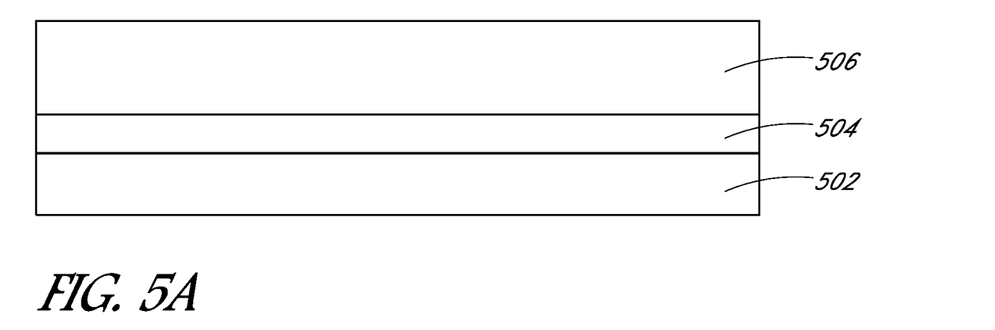
FIGS. 5A-5E illustrate cross-sectional views of various processing operations in another method of fabricating solar cells having contact structures, in accordance with an embodiment of the present disclosure.

Referring to FIG. 5A, a silicon substrate or region 502 has an insulating layer 504 formed thereon. In an embodiment, the insulating layer is a silicon oxide layer having a thickness of approximately 100 Angstroms. In one such embodiment, an additional insulating layer 506 is disposed thereon, such as a silicon nitride layer.

Figure 5B:
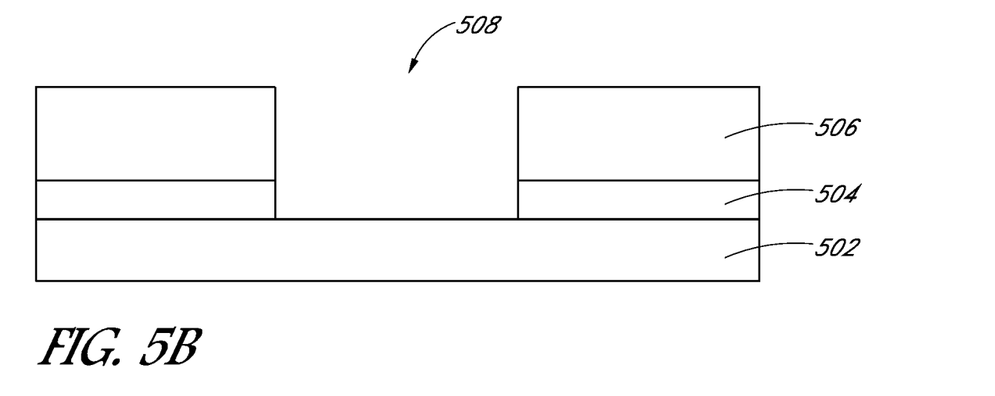

Referring to FIG. 5B, both the additional insulating layer 506 and the insulating layer 504 are recessed to provide have a trench 508 formed therein, exposing the top surface of the silicon substrate or region 502.

Figure 5C:
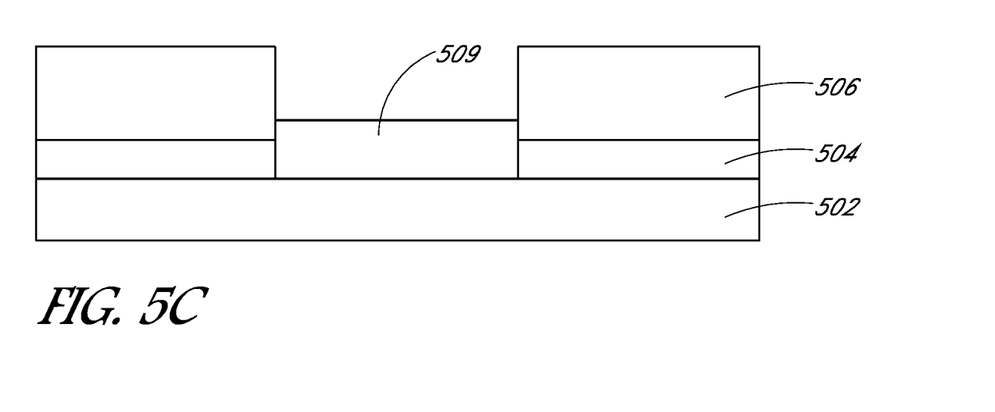

Referring to FIG. 5C, a metal layer 509 is formed in the trench 508. In an embodiment, the metal layer 509 is formed selectively on the top surface of the silicon substrate or region 502. In one embodiment, the metal layer 509 includes tungsten metal deposited via a selective chemical vapor deposition (CVD) process. Tungsten can be selectively deposited on silicon according to the reaction $2WF_6 + 3Si \rightarrow 2W + 3SiF_4$ at pressures of a few Torr. The reaction is favored over deposition of W onto $SiO_2$ and/or silicon nitride (SiNx). The reaction is self limiting at approximately 250 Angstroms of tungsten deposition on the exposed silicon. In one embodiment, $SiH_4$ is mixed into the process gas and thicker tungsten layers are grown while maintaining good selectivity. In a particular such embodiment, a process window for $SiH_4/WF_6$ process chemistry involves a substrate temperature approximately in the range of 280-350 degrees Celsius, a total pressure of approximately 100 mTorr, a $SiH_4/WF_6$ flow ratio less than approximately 0.6, and $H_2$ carrier gas flow rate of approximately 1000 sccm. In another embodiment, the metal layer 509 includes titanium silicide deposited via a selective CVD process. Selective deposition of titanium disilicide on silicon can be performed using $TiCl_4$ and $SiH_4$ as precursor gasses to achieve low resistance contacts to silicon.

Figure 5D:
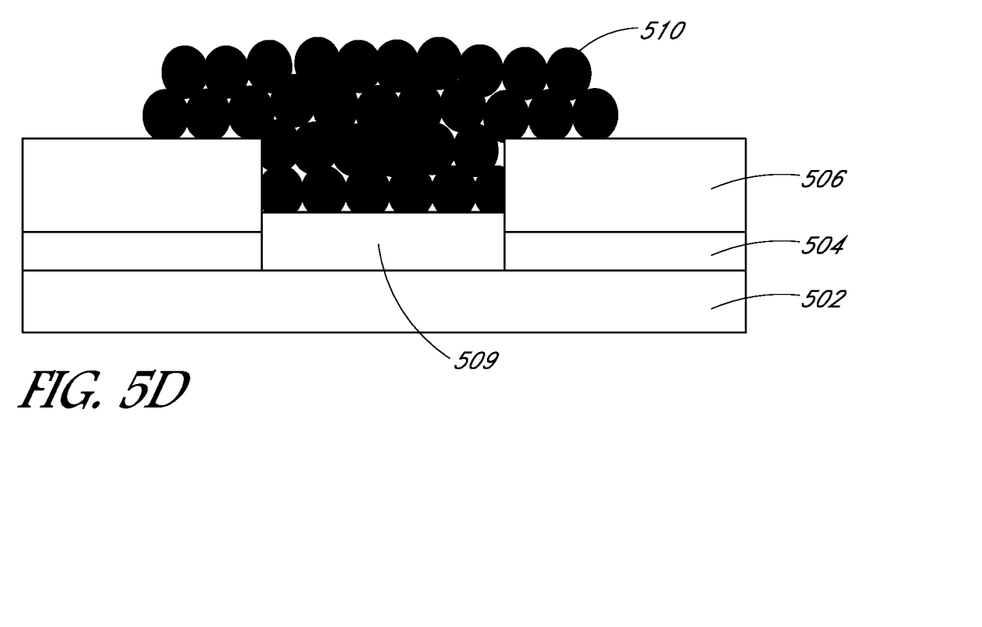

Referring to FIG. 5D, a metal paste 510 is formed in the trench 408 and on the metal layer 509. In an embodiment, the metal paste 510 is printed and includes Al or Al/Si particles, as described above.

Figure 5E:
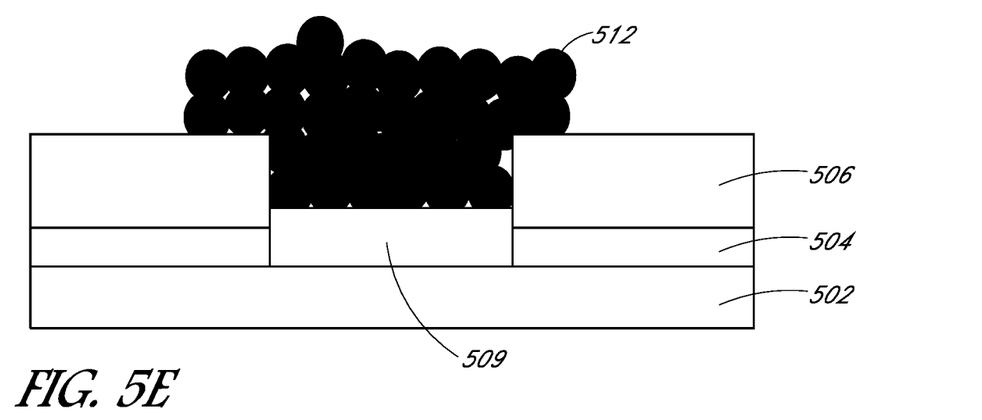

Referring to FIG. 5E, the metal paste 510 is fired (e.g., thermally annealed or laser annealed) to form a conductive layer 512. In the illustrated embodiment, the conductive layer 512 does not directly contact the silicon substrate or region 502 because the intervening metal layer 509 remains. In an embodiment, the paste is fired above the melting point of the particles to enable good particle to particle and particle to SiNx adhesion. Where a tungsten or titanium silicide barrier layer is used, a physical barrier is created to prevent polysilicon from diffusing into the aluminum paste matrix. In accordance with an embodiment of the present disclosure, the conductive layer 512 and the metal layer 509 together are used to fabricate a conductive contact structure for a solar cell.

As also described briefly above, and in greater detail below in association with FIGS. 6A and 6B, in a second aspect of the present disclosure, a tunnel dielectric barrier layer is implemented for contact formation based on printable metal paste. In an exemplary embodiment, a tunneling dielectric layer is used as a barrier layer to ultimately prevent or reduce silicon pitting when firing an aluminum-based metal paste. In general, dielectric layers, such as oxides, prevent pitting below the dielectric, but by their very nature are not employed as a metallization barrier due to their electrically insulating properties. In an embodiment, by using a thin dielectric layer, charge carriers can tunnel through the dielectric such that current can pass and an electrical circuit can be closed. Even at such small thicknesses, however, the dielectric layer can maintain the diffusion barrier properties which prevent/reduce silicon pitting.

To provide further context, use of aluminum particles within a printable paste is a common approach for depositing a metal solar cell contact in standard front-contact silicon solar cells. When fired (i.e., annealed) to temperatures as high as approximately 550 degrees Celsius in order to sinter the aluminum particles and form contact between the aluminum paste and the silicon substrate, the aluminum can react with the silicon to form a eutectic alloy of aluminum and silicon, with the silicon as the diffusing species. Such consumption of silicon is commonly referred to as pitting or spiking. In standard cells, this effect is not detrimental enough to be significant, but in high efficiency cells the pitting can lead to a significant reduction in cell performance. One approach for addressing the above issue is to alloy the aluminum particles with silicon in order to decrease the pitting effect. However, even at silicon concentrations greater than the eutectic, pitting can still observed due to the formation of precipitates and transient behavior of the silicon concentration within aluminum while heating the system. Another solution to avoid pitting includes inhibiting a firing or annealing temperature from activating a significant amount of the pitting reaction. However, even at temperatures below the Al/Si eutectic formation temperature of 577 degrees Celsius, spiking can still occur. Additionally, at such lower temperatures, it can be difficult to make electrical contact between the aluminum particles and the silicon substrate or regions, and still achieve the necessary adhesion of the paste to the substrate or region. Another influence on the pitting reaction can include particle size, which has an effect both on the silicon concentration gradients within particles and on the reaction of the particles with the substrate to form contacts. By combining these approaches, the pitting reaction can be managed, but the combination can still have shortcomings which limit the processing window and/or cell performance. While these approaches can reduce the effect of pitting, none of these options prevents pitting completely. The disclosed structures and techniques can improve on those shortcomings.

Figure 6A:
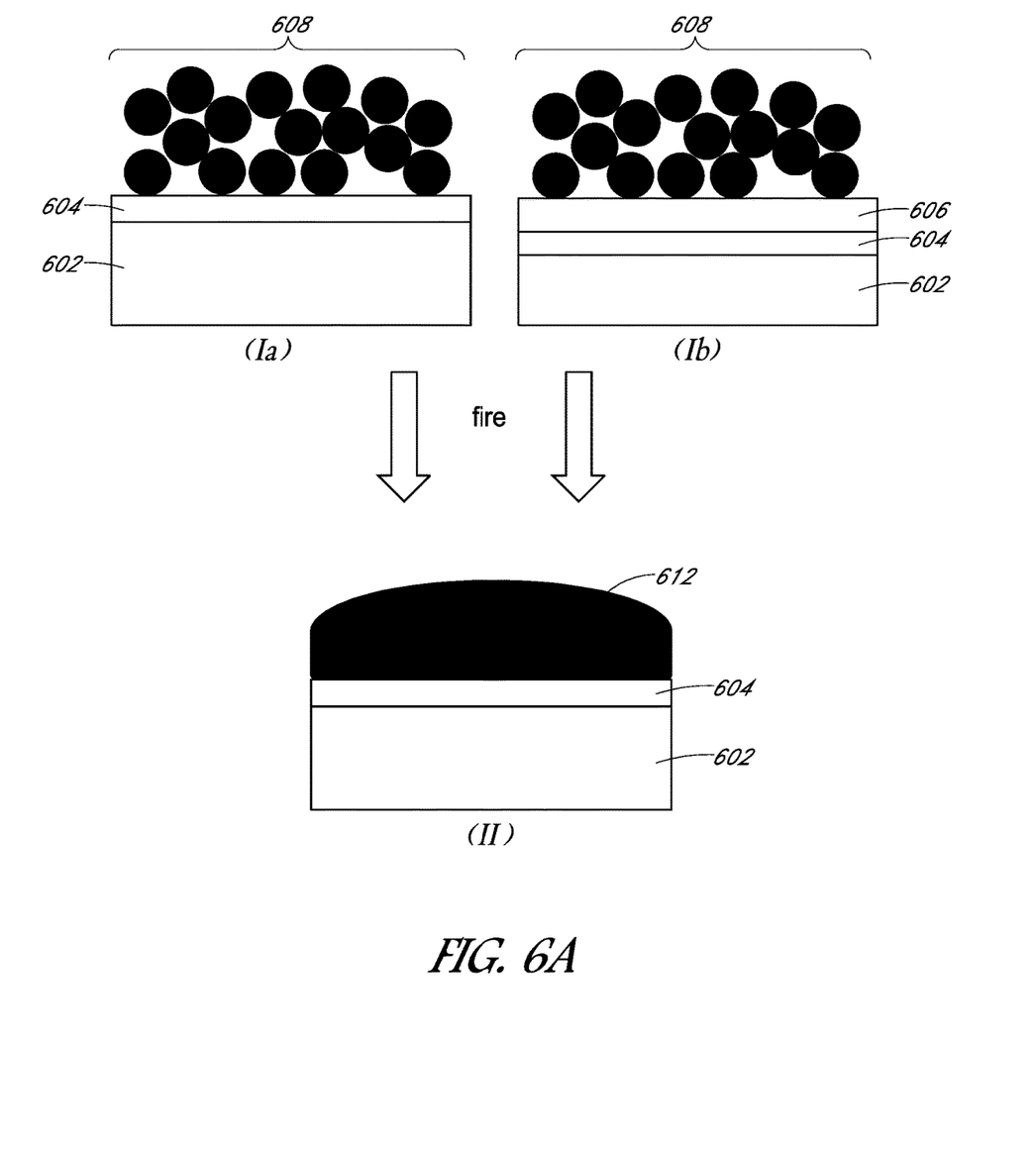
FIG. 6A illustrates cross-sectional views of various processing operations in another method of fabricating solar cells having contact structures, in accordance with an embodiment of the present disclosure.

In a first example, FIG. 6A illustrates cross-sectional views of various processing operations in another method of fabricating solar cells having contact structures, in accordance with an embodiment of the present disclosure.

Referring to part (Ia) of FIG. 6A, in the fabrication of a solar cell having emitter regions formed in a monocrystalline silicon substrate 602, a tunnel dielectric layer 604 is formed on the monocrystalline silicon substrate 602. A metal paste layer 608 is then formed on the tunnel dielectric layer 604. Referring to part (Ib) of FIG. 6A, in another embodiment, a polycrystalline silicon layer 606 is formed on the tunnel dielectric layer 604, and the metal paste layer 608 is formed on the polycrystalline silicon layer 606.

Referring to part (II) of FIG. 6A, for either case (Ia) or (Ib), the metal paste layer 608 is fired (e.g., by thermal or laser anneal) to form a conductive layer 612 on the tunnel dielectric layer 604. It is to be appreciated that, for the case of part (Ib), the conductive layer 612 of part (II) will include therein silicon from the polycrystalline silicon layer 606. In accordance with an embodiment of the present disclosure, the conductive layer 612 is used to form a conductive contact structure for a back contact solar cell.

Figure 6B:
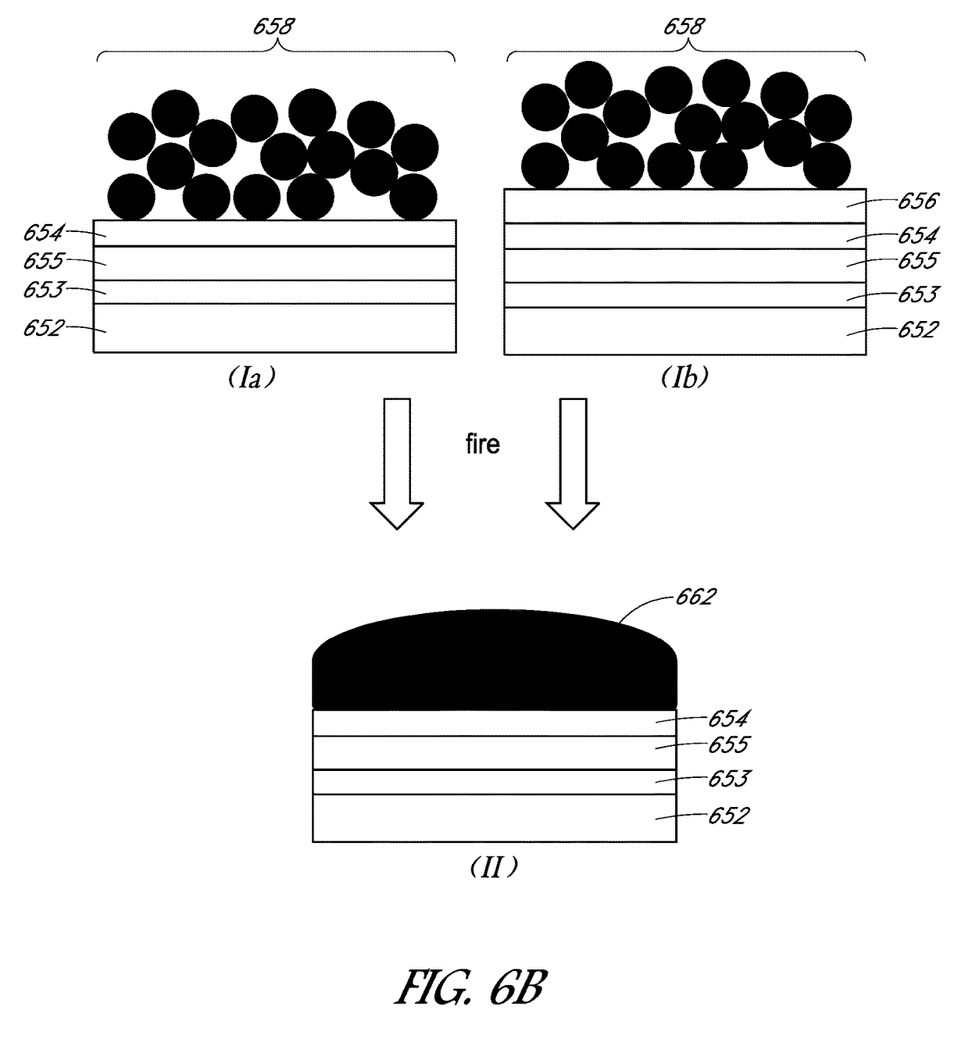
FIG. 6B illustrates cross-sectional views of various processing operations in another method of fabricating solar cells having contact structures, in accordance with an embodiment of the present disclosure.

In a second example, FIG. 6B illustrates cross-sectional views of various processing operations in another method of fabricating solar cells having contact structures, in accordance with an embodiment of the present disclosure.

Referring to part (Ia) of FIG. 6B, emitter regions are/will be formed using a first polycrystalline silicon layer 655 disposed on a first tunnel dielectric layer 653, the first tunnel dielectric layer 653 disposed on a silicon substrate 652. A second tunnel dielectric layer 654 is then formed on the first polycrystalline silicon layer 655. A metal paste layer 658 is then formed on the second tunnel dielectric layer 654. Referring to part (Ib) of FIG. 6B, in another embodiment, a second polycrystalline silicon layer 656 is formed on the second tunnel dielectric layer 654, and the metal paste layer 658 is formed on the second polycrystalline silicon layer 656.

Referring to part (II) of FIG. 6B, for either case (Ia) or (Ib), the metal paste layer 658 is fired (e.g., by thermal or laser anneal) to form a conductive layer 662 on the second tunnel dielectric layer 654. It is to be appreciated that, for the case of part (Ib), the conducive layer 662 of part (II) will include therein silicon from the second polycrystalline silicon layer 656. In accordance with an embodiment of the present disclosure, the conductive layer 662 is used to form a conductive contact structure for a back contact solar cell.

Accordingly, referring again to FIGS. 6A and 6B, in an embodiment a thin dielectric layer is used to prevent pitting of an underlying silicon region or layer and yet allow current to pass through the thin dielectric layer. The ability for current to pass through the dielectric layer allows for current transport out of the cell. By employing such a pitting barrier, the temperature for firing can be increased to optimize paste sintering for electrical performance and adhesion, without a concern for pitting. Since the pitting mechanism is blocked, the aluminum does not need to be alloyed, which reduces the complexity and cost of the paste. Furthermore, since the particles can be melted, there is little to no concern over particle size and number of point contacts to the substrate surface. The melting effect also increases adhesion which can negate the need for specialized binders or frits within the paste to promote adhesion in the lower temperature systems.

In an embodiment, referring again to part (Ib) of FIGS. 6A and 6B, in the case that a sacrificial polycrystalline silicon is used in the fabrication of a contact structure including a tunnel dielectric layer, the sacrificial polycrystalline silicon is used to protect the tunnel dielectric layer from damage during processing and/or to improve the wettability of the metal paste on the tunnel dielectric layer. For example, if the tunnel dielectric layer is a thin silicon oxide layer, an overlying polycrystalline of amorphous silicon layer can prevent further uncontrolled oxidation of the thin oxide layer, which might otherwise compromise the thin oxide interfaces or uncontrollably increase the thin oxide thickness. In an embodiment, the tunnel dielectric layer 604 or 654 is deposited by a chemical vapor deposition (CVD) method, such as but not limited to plasma enhanced CVD (PECVD), low pressure CVD (LPCVD) or atmospheric pressure CVD (APCVD). Atomic layer deposition (ALD) is another option for tight control in the deposition of thin dielectric films. The tunnel dielectric layer may also be grown as a thin oxide film, using chemical oxidation or thermal oxidation. In further embodiments, the thin silicon oxide layer is subjected to nitridation. In addition to the use of a silicon oxide as a tunnel dielectric layer, silicon oxynitrides or aluminum oxides may also be used.

As also described briefly above, and in greater detail below in association with FIGS. 7A-7D, in a third aspect of the present disclosure, metallization of back contact solar cells is performed by reorganizing/changing a fabrication process flow of the metallization sequence in order to take advantages of one or more technological phenomenon. For example, in an embodiment, metallization is performed by forming a nickel (Ni) silicide layer as an interface between a metal stack of a conductive contact structure and the corresponding silicon substrate or region to reduce the contact and device series resistances. In another embodiment, associated critical risks of cell fabrication are switched from the paste development/formulation to the plating development and silicide-based contact formation. In another embodiment, improved efficiency is achieved by the formation of, and ultimate retentions of, Ni silicide as compared to an Al—Si contact formed at a temperature below the eutectic point. In another embodiment, a standard Al-only paste can be used at low cost, instead of using a higher cost Al—Si particle based paste.

In an example, FIGS. 7A-7D illustrate cross-sectional views of various processing operations in another method of fabricating solar cells having contact structures, in accordance with an embodiment of the present disclosure.

Figure 7A:
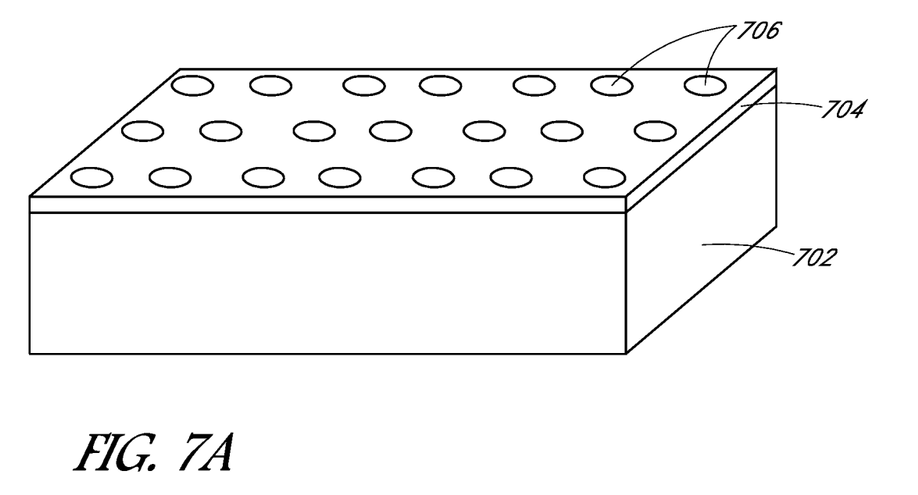
FIGS. 7A-7D illustrate cross-sectional views of various processing operations in another method of fabricating solar cells having contact structures, in accordance with an embodiment of the present disclosure.

Referring to FIG. 7A, an insulating layer 704 is formed above a silicon substrate or region 702. Contact openings 706 are formed in the insulating layer 704, exposing the top surface of the silicon substrate or region 702. In an embodiment, the insulating layer 704 includes a silicon nitride layer, a silicon oxide layer, or both. In an embodiment, the contact openings 706 are formed by laser ablation or by a lithography and etch process.

Figure 7B:
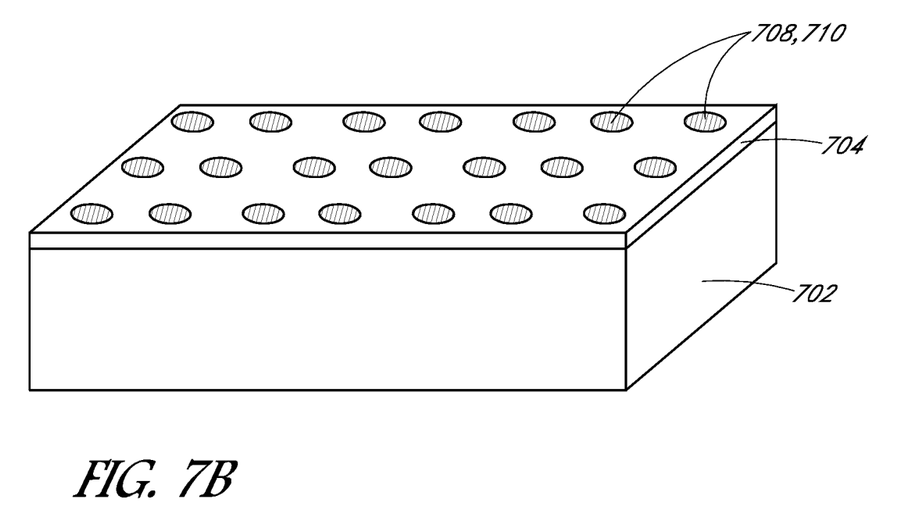

Referring to FIG. 7B, a metal layer 708 is formed in the contact openings 706, on the exposed top surface of the silicon substrate or region 702. In an embodiment, the metal layer 708 is a thin nickel layer (e.g., between approximately 0.1 to 2 microns) formed by electroless plating. In one such embodiment, an activation operation is used involving an approximately 4% hydrofluoric acid (HF) exposure for several seconds.

Referring again to FIG. 7B, an annealing operation is performed to form a metal silicide material 710 upon reaction of the metal layer 708 and silicon from the silicon substrate or region 702. In an embodiment, the anneal is performed in an atmosphere suitable for forming silicides, such as a forming gas anneal atmosphere, nitrogen or air. At this stage, any nickel that is not reacted (i.e., nickel not used in the formation of a silicide) can then be removed, e.g., by wet etching. It is to be appreciated that more than one metal deposition process may be performed to ultimately provide a suitable metal silicide layer. In another embodiment, a nickel layer is formed on, or is retained on, the metal silicide layer.

Figure 7C:
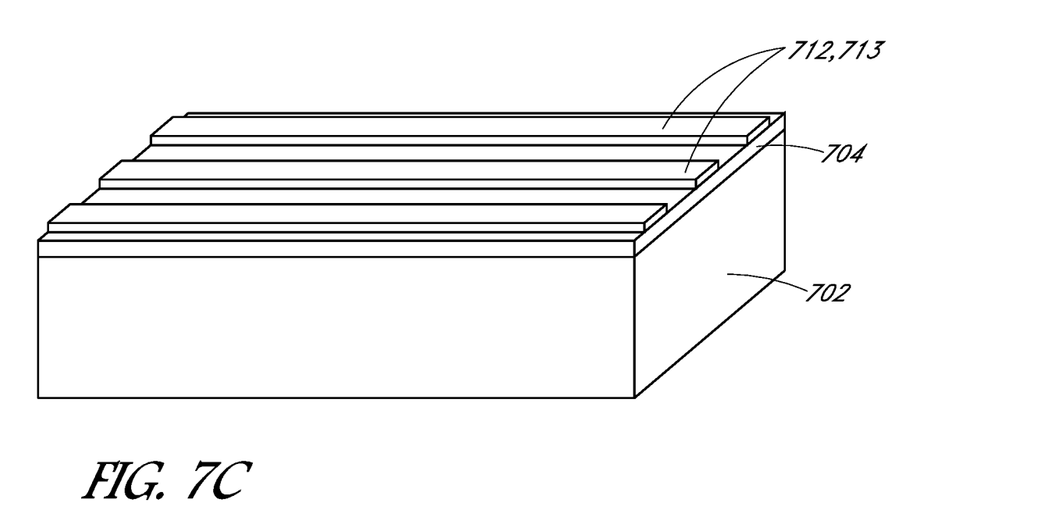

Referring to FIG. 7C, a metal paste 712 is formed on the insulating layer 704 and in contact with the metal silicide material 710 formed in the contact openings 706. In an embodiment, the metal paste 410 is printed and includes Al or Al/Si particles, as described above. In an embodiment, a single line of metal paste contacts the metal silicide material 710 of a plurality of the contact openings 706. In an embodiment, the metal of the metal paste 712 is pure aluminum and the paste contains specific binders suitable for bonding the aluminum particles to the insulating layer 704 and to the metal silicide 710. In one such embodiment, a binder such as, but not limited to, ZnOx, BiOx, SnOx, or an inorganic polymer such as phenyl (methyl) silsesquioxane is used. In an embodiment, the paste is then dried and fired (e.g., thermally annealed or laser annealed) with a specific temperature profile to form a conductive layer 713. The drying and firing may also burn organics, solvents and reach an acceptable sheet resistance for further plating processes.

The temperature may be determined by the composition of the paste and the effect on the nickel and/or nickel silicide layers. It is to be appreciated that, in another embodiment, the annealing to form a metal silicide and the paste firing may be performed in a single operation upon deposition of the metal paste.

Figure 7D:
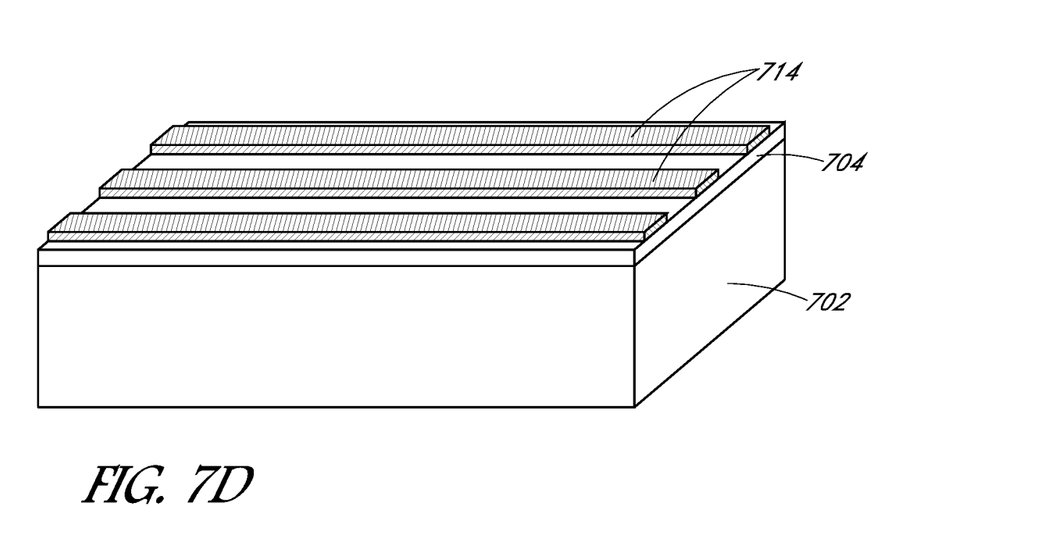

Referring to FIG. 7D, conductive contact structures 714 are fabricated for a solar cell from the conductive layer 713, and includes the metal silicide material 710 (as retained in the openings 706. In an embodiment, the conductive contact structures 714 are formed by performing an electroless zinc deposition (i.e., to form zincate) to activate the aluminum paste prior to a copper plating operation. Copper plating is then performed followed by a tin plating operation and/or an organic solder preservative (OSP) deposition process for further soldering.

Thus, approaches for the metallization of solar cells and the resulting solar cells have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

In an embodiment, a method of fabricating a solar cell involves forming a barrier layer on a semiconductor region disposed in or above a substrate, the semiconductor region including monocrystalline or polycrystalline silicon. The method also involves forming a conductive paste layer on the barrier layer. The method also involves forming a conductive layer from the conductive paste layer. The method also involves forming a contact structure for the semiconductor region of the solar cell, the contact structure including at least the conductive layer.

In one embodiment, forming the barrier layer involves forming an insulating layer.

In one embodiment, forming the insulating layer involves forming a silicon oxide layer.

In one embodiment, forming the insulating layer further involves forming and partially recessing a silicon nitride layer on the silicon oxide layer.

In one embodiment, forming the conductive layer from the conductive paste layer involves forming the conductive layer through the insulating layer and in contact with the semiconductor region of the solar cell.

In one embodiment, forming the barrier layer involves forming a metal-containing layer.

In one embodiment, forming the metal-containing layer involves forming a layer including a metal such as, but not limited to, nickel (Ni), titanium (Ti) or tungsten (W).

In one embodiment, forming the conductive layer from the conductive paste layer involves forming the conductive layer in contact with the metal-containing layer.

In one embodiment, forming the barrier layer involves forming a tunneling dielectric layer.

In one embodiment, forming the tunneling dielectric layer involves forming a thin silicon oxide layer.

In one embodiment, forming the barrier layer further involves forming a silicon layer on the tunneling dielectric layer.

In one embodiment, forming the conductive layer involves consuming at least a portion of the silicon layer with the conductive paste layer.

In one embodiment, forming the conductive layer from the conductive paste layer involves forming the conductive layer in contact with the tunneling dielectric layer.

In one embodiment, forming the barrier layer involves forming a metal silicide layer including silicon from the semiconductor region.

In one embodiment, forming the metal silicide layer involves forming a nickel silicide layer by plating a nickel (Ni) layer, activating the Ni layer, and annealing the Ni layer to react with the semiconductor region.

In one embodiment, the method further involves, subsequent to annealing the Ni layer to react with the semiconductor region, removing any unreacted Ni prior to forming the conductive paste layer.

In one embodiment, forming the conductive paste layer involves forming an aluminum (Al) paste layer on the nickel silicide layer.

In one embodiment, forming the conductive layer from the conductive paste layer involves firing the conductive paste layer at a temperature above approximately 500 degrees Celsius for a duration of at least approximately 10 minutes.

In one embodiment, forming the conductive paste layer involves forming a mixture including aluminum/silicon (Al/Si) particles, a liquid binder, and a frit material.

In one embodiment, forming the conductive paste layer involves screen printing the conductive paste layer.

In one embodiment, forming the contact structure further involves plating a first metal layer on the conductive layer, and plating a second metal layer on the first metal layer.

In an embodiment, a solar cell includes a substrate. A polycrystalline silicon layer of an emitter region is disposed above the substrate. A contact structure is disposed on the polycrystalline silicon layer of the emitter region and includes a conductive layer in contact with a barrier layer disposed on the polycrystalline silicon layer of the emitter region. The conductive layer includes a matrix binder having aluminum-containing particles dispersed therein.

In one embodiment, the barrier layer is a metal-containing layer.

In one embodiment, the metal-containing layer comprises a metal such as, but not limited to, nickel (Ni), titanium (Ti) and tungsten (W).

In one embodiment, the barrier layer is a tunneling dielectric layer.

In one embodiment, the tunneling dielectric layer includes a thin silicon oxide layer.

In one embodiment, the barrier layer is a metal silicide layer.

In one embodiment, the metal silicide layer is a nickel (Ni) silicide layer.

In one embodiment, the aluminum-containing particles are aluminum/silicon (Al/Si) particles.

In one embodiment, the aluminum-containing particles are aluminum-only particles.

In one embodiment, the contact structure further includes a nickel (Ni) or zinc (Zn) layer, or both, disposed on the conductive layer, and a copper (Cu) layer disposed on the Ni or Zn layer.

In one embodiment, the solar cell is a back-contact solar cell.

In an embodiment, a solar cell includes a monocrystalline silicon substrate. A diffusion region is disposed in the monocrystalline silicon substrate. A contact structure is disposed on the diffusion region and includes a conductive layer in contact with a barrier layer disposed on the diffusion region. The conductive layer includes a matrix binder having aluminum-containing particles dispersed therein.

In one embodiment, the barrier layer is a metal-containing layer.

In one embodiment, the metal-containing layer includes a metal such as, but not limited to, nickel (Ni), titanium (Ti) or tungsten (W).

In one embodiment, the barrier layer is a tunneling dielectric layer.

In one embodiment, the tunneling dielectric layer includes a thin silicon oxide layer.

In one embodiment, the barrier layer is a metal silicide layer.

In one embodiment, the metal silicide layer is a nickel (Ni) silicide layer.

In one embodiment, the aluminum-containing particles are aluminum/silicon (Al/Si) particles.

In one embodiment, the aluminum-containing particles are aluminum-only particles.

In one embodiment, the contact structure further includes a nickel (Ni) or zinc (Zn) layer, or both, disposed on the conductive layer, and a copper (Cu) layer disposed on the Ni or Zn layer.

In one embodiment, the solar cell is a back-contact solar cell.

What is claimed is:

1. A solar cell, comprising:
   a first tunnel dielectric layer on a silicon substrate;
   an emitter region on the first tunnel dielectric layer;
   a second tunnel dielectric layer on the emitter region; and
   a conductive contact on the second tunnel dielectric layer, the conductive contact comprising a metal and silicon, and the conductive contact having a lateral width the same as a lateral width of the second tunnel dielectric layer.

2. The solar cell of claim 1, wherein the emitter region is vertically over the first tunnel dielectric layer, the second tunnel dielectric layer is vertically over the emitter region, and the conductive contact is vertically over the second tunnel dielectric layer.

3. The solar cell of claim 1, wherein the first tunnel dielectric layer is a first silicon oxide layer, and the second tunnel dielectric layer is a second silicon oxide layer.

4. The solar cell of claim 1, wherein the second tunnel dielectric layer is a layer selected from the group consisting of a silicon oxide layer, a silicon oxynitride layer, and an aluminum oxide layer.

5. The solar cell of claim 1, wherein the emitter region comprises polycrystalline silicon.

6. The solar cell of claim 1, wherein the conductive contact comprises aluminum.

7. The solar cell of claim 1, wherein the emitter region in an n-type emitter region.

8. The solar cell of claim 1, wherein the emitter region in a p-type emitter region.

9. A back contact solar cell, comprising:
   a monocrystalline silicon substrate having a back surface opposite a light-receiving surface;
   a first silicon oxide layer on the monocrystalline silicon substrate;
   a polycrystalline silicon layer on the first silicon oxide layer;
   a second silicon oxide layer on the polycrystalline silicon layer; and
   a conductive layer on the second silicon oxide layer, the conductive layer comprising a metal and silicon, and the conductive layer having a lateral width the same as a lateral width of the second silicon oxide layer.

10. The solar cell of claim 9, wherein the polycrystalline silicon layer is vertically over the first silicon oxide layer, the second silicon oxide layer is vertically over the polycrystalline silicon layer, and the conductive layer is vertically over the second silicon oxide layer.

11. The solar cell of claim 9, wherein the conductive layer comprises aluminum.

12. The solar cell of claim 9, wherein the polycrystalline silicon layer is an n-type polycrystalline silicon layer.

13. The solar cell of claim 9, wherein the polycrystalline silicon layer is a p-type polycrystalline silicon layer.

* * * * *